(12) United States Patent
Yuan et al.

(10) Patent No.: US 8,987,781 B2
(45) Date of Patent: Mar. 24, 2015

(54) STRUCTURE OF HETEROJUNCTION FIELD EFFECT TRANSISTOR AND A FABRICATION METHOD THEREOF

(75) Inventors: Cheng-Guan Yuan, Tao Yuan Shien (TW); Shih-Ming Liu, Tao Yuan Shien (TW)

(73) Assignee: Win Semiconductors Corp., Tao Yuan Shien (TW)

( * ) Notice: Subject to any disclaimer, the term of this patent is extended or adjusted under 35 U.S.C. 154(b) by 1021 days.

(21) Appl. No.: 13/082,042

(22) Filed: Apr. 7, 2011

(65) Prior Publication Data

US 2012/0091507 A1 Apr. 19, 2012

(30) Foreign Application Priority Data

Oct. 13, 2010 (TW) .............................. 099134920 A

(51) Int. Cl.
*H01L 29/80* (2006.01)
*H01L 29/205* (2006.01)
*H01L 29/423* (2006.01)
*H01L 29/778* (2006.01)

(52) U.S. Cl.
CPC ........ *H01L 29/205* (2013.01); *H01L 29/42316* (2013.01); *H01L 29/7787* (2013.01)
USPC .............. 257/192; 257/E29.31; 257/E21.219; 438/745

(58) Field of Classification Search
USPC .............. 257/192, E29.31, E21.219; 438/745
See application file for complete search history.

(56) References Cited

U.S. PATENT DOCUMENTS

| 6,043,518 A * | 3/2000 | Hsu et al. ....................... 257/192 |
| 2002/0185655 A1* | 12/2002 | Fahimulla et al. ............. 257/192 |
| 2009/0242873 A1* | 10/2009 | Pillarisetty et al. ............. 257/24 |

* cited by examiner

*Primary Examiner* — Marc Armand
(74) *Attorney, Agent, or Firm* — Muncy, Geissler, Olds & Lowe, P.C.

(57) ABSTRACT

An improved structure of heterojunction field effect transistor (HFET) and a fabrication method thereof are disclosed. The improved HFET structure comprises sequentially a substrate, a channel layer, a spacing layer, a carrier supply layer, a Schottky layer, a Schottky capping layer formed by a higher energy gap material, a tunneling layer formed by a lower energy gap material, a first etching stop layer, and a first n type doped layer. The fabrication method is a multiple selective etching process, which comprises steps of: etching the n type doped layer by using a first etching process to form a first indentation; etching first etching stop layer by using a second etching process to form a second indentation located under the first indentation; etching the tunneling layer by using a third etching process to form a third indentation located under the second indentation, wherein the said first, second and third indentations form a single gate groove, in which the gate electrode can form a Schottky contact with the Schottky capping layer that is made of a higher energy gap material.

12 Claims, 9 Drawing Sheets

STRUCTURE OF HETEROJUNCTION FIELD EFFECT TRANSISTOR AND A FABRICATION METHOD THEREOF

FIELD OF THE INVENTION

The present invention relates to a heterojunction field effect transistor (HFET) and a fabrication method thereof, in particular to an improved structure in which a Schottky capping layer formed by a higher energy gap material is covered on a Schottky layer, and a tunneling layer formed by a lower energy gap material is covered on the Schottky capping layer, and a multiple selective etching process is used to fabricate the device structure so that the device can sustain a high gate voltage while keeping a low on-state resistance.

BACKGROUND OF THE INVENTION

A heterojunction field effect transistor (HFET), such as a high election mobility transistor (HEMT), is an important device for the applications in wireless communications, such as low noise amplifiers for RF (radio frequency) signals and switch elements in integrated wireless circuits.

FIG. 1A is a cross section view for a conventional HFET device, which comprises sequentially: a substrate 101, a channel layer 102, a spacing layer 103, a carrier supply layer 104, a Schottky layer 105, a first etching stop layer 106, and a first n type doped layer 107, which is usually heavily doped for facilitating ohmic contacts. The substrate 101 is a GaAs substrate. The channel layer 102 is formed epitaxially on the substrate 101, which can be a GaAs layer or an InGaAs layer. On top of the channel layer 102 are the modulation doped layers, comprising sequentially the spacing layer 103, the carrier supply layer 104, and the Schottky layer 105. The modulation doped layers are generally made of a medium energy gap material, preferably $Al_xGa_{1-x}As$ layers with Al contents around 0.3. The spacing layer 103 and the Schottky layer 105 are generally undoped AlGaAs, while the carrier supply layer 104 is a doped AlGaAs layer, from which carriers can be transferred into the channel layer 102 and controlled by a gate voltage. On the Schottky layer 105 are the first etching stop layer 106 and the first n type doped layer 107 formed thereon. The first etching stop layer 106 is used for fabricating a gate groove so that the gate electrode 108 can make a Schottky contact with the Schottky layer 105. Because the etchant for selective etching the Schottky layer 105 and the first n type doped layer 107 is not usually available, a first etching stop layer 106 inserted between the Schottky layer 105 and the first n type doped layer 107 is necessary. Therefore, the first etching stop layer 106 must be made of a material that has a high etching selectivity with the Schottky layer 105 and the first n type doped layer 107, such that the etching depth can be precisely controlled. Finally, metal layers acting as the source electrode 109 and the drain electrode 110 are deposited on the first n type doped layer 107 to form ohmic contacts. In order to improve the device performance, especially the break down voltage between the gate electrode and the drain electrode, a dual-gate-groove structure has been developed, as shown in FIG. 1B. The dual-gate-groove structure is formed by a wider indentation located on a narrower indentation. To form the dual-gate-groove structure, a second etching stop layer 106a, and a second n type doped layer 107a thereon, must be inserted between the first etching stop layer 106 and the Schottky layer 105. This kind of structure has been widely used in the past. The advantage of this structure is that a superior Schottky contact characteristics can be obtained since the Schottky layer 105 is made of a medium energy gap material. However, this structure also has a drawback. When the device is at on state, it will have a large on-state resistance, $R_{on}$, due to the large difference in energy gap between the Schottky layer 105 and the first n type doped layer 107.

To overcome this drawback, an improved HFET structure had been developed, which is shown in FIG. 2A. Comparing with the conventional HFET shown in FIG. 1A, the main difference is that a tunneling layer 211 is inserted between the Schottky layer 205 and the first etching stop layer 206, as shown in FIG. 2A. For a dual-gate-groove structure, the tunneling layer 211 should be inserted between the second etching stop layer 206a and the Schottky layer 205, as shown in FIG. 2B. The tunneling layer 211 is made of a lower energy gap material so that the contact resistance between the source electrode 209 (or the drain electrode 210) and the channel layer 202 can be reduced, such that the on-state resistance, $R_{on}$, of the device can also be reduced. However, in this structure, the gate electrode 208 has to contact directly with the tunneling layer 211. Because the tunneling layer 211 is made of a lower energy gap material, the Schottky breakdown voltage would be decreased, which limits the device applications considerably. Furthermore, the surface state of low energy gap semiconductor is relatively unstable so that the fabrication process for the gate electrode easily become unstable and the reliability of the device is then reduced.

In view of these facts and for overcoming the drawback stated above, the present invention provides an improved HFET structure and a fabrication method thereof. The devices according to the present invention not only have a low resistance at on state, but also have a high breakdown voltage of Schottky contact so that its reliability is largely improved. Furthermore, the fabrication process for the devices has a high stability.

SUMMARY OF THE INVENTION

The main object of the present invention is to provide an improved HFET structure, in which a Schottky capping layer formed by a higher energy gap material and a tunneling layer formed by a lower energy gap material are further covered on the Schottky layer. Thereby, the structure disclosed in the present invention has the following advantages:

1. The resistance of the HFET device at on state can be decreased, and
2. The breakdown voltage of the Schottky contact can be increased.

Hence, the device reliability can be preserved.

Another object of the present invention is to provide a fabrication method for the improved HFET structure. In this method, a multiple selective etching is used, so the fabrication process is flexible and can be repeatedly performed.

To reach the objects stated above, the present invention provides an improved HFET structure with a single-gate-groove structure, which comprises sequentially:
 a substrate,
 a channel layer,
 a spacing layer,
 a carrier supply layer,
 a Schottky layer formed by a medium energy gap material,
 a Schottky capping layer formed by a higher energy gap material,
 a tunneling layer formed by a lower energy gap material,
 a first etching stop layer,
 a first n type doped layer that is heavily doped,
 a source electrode,
 a drain electrode, and
 a gate electrode;

wherein the gate electrode forms a Schottky contact with the higher energy gap Schottky capping layer in a gate groove fabricated by a multiple selective etching process.

The present invention also provides another improved HFET structure with a dual-gate-groove structure, which comprises sequentially:
    a substrate,
    a channel layer,
    a spacing layer,
    a carrier supply layer,
    a Schottky layer formed by a medium energy gap material,
    a Schottky capping layer formed by a higher energy gap material,
    a tunneling layer formed by a lower energy gap material,
    a second etching stop layer,
    a second n type doped layer that is lightly doped,
    a first etching stop layer,
    a first n type doped layer that is heavily doped,
    a source electrode,
    a drain electrode, and
    a gate electrode;
wherein the gate electrode forms a Schottky contact with the higher energy gap Schottky capping layer in a dual-gate-groove structure consisting of a first gate-groove and a second gate-groove structures. The first gate-groove and the second gate-groove structures are fabricated by a multiple selective etching process.

In an embodiment, $Al_xGa_{1-x}As$ is a preferable material for the said higher energy gap material for the Schottky capping layer, and the preferable Al content, x, is between 0.3 and 1.0. The thickness for the higher energy gap Schottky capping layer is preferably between 1 and 15 nm.

In an embodiment, the said lower energy gap material for the tunneling layer is preferably GaAs or InGaAs, and the preferable thickness is between 1 and 10 nm.

In an embodiment, AlAs is a preferable material for the first and the second etching stop layers.

In an embodiment, InGaP is a preferable material for the said first and second etching stop layers.

In an embodiment, GaAs is a preferable material for the said first and second n type doped layers.

In an embodiment, $Al_xGa_{1-x}As$ is a preferable material for the said first and second n type doped layers. And the preferable Al content, x, is between 0 and 0.3

To reach the objects stated above, the present invention further provides a fabrication method for an improved HFET structure with a single gate-groove structure. The method is basically a multiple selective etching process, which enables the gate electrode to make a Schottky contact directly with the higher energy gap Schottky capping larger, comprising the following steps:
    Providing a HFET structure with a single-gate-groove structure, which consists of a substrate, a channel layer, a spacing layer, a carrier supply layer, a Schottky layer, a Schottky capping layer, a tunneling layer, a first etching stop layer, a second n type doped layer, a source electrode, a drain electrode, and a gate electrode;
    Etching the first n type doped layer to form a first indentation;
    Etching the first etching stop layer to form a second indentation located under the first indentation;
    Etching the tunneling layer to form a third indentation located under the second indentation. The said first, second and third indentations form a single-gate-groove, in which the gate electrode can form a Schottky contact with the higher energy gap Schottky capping layer.

The present invention also provides another fabrication method for an improved HFET structure with a dual-gate-groove structure. The method is a multiple selective etching process, which enables the gate electrode to form a Schottky contact directly with the higher energy gap Schottky capping layer, comprising the following steps:
    Providing a structure of HFET with a dual-gate-groove structure, which consists of a substrate, a channel layer, a spacing layer, a carrier supply layer, a Schottky layer, a Schottky capping layer, a tunneling layer, a second etching stop layer, a second n type doped layer, a first etching stop layer, a first n type doped layer, a source electrode, a drain electrode, and a gate electrode;
    Etching the first n type doped layer to form a first indentation;
    Etching the first etching stop layer to form a second indentation located under the first indentation;
    Etching the second n type doped layer to form a third indentation;
    Etching the second etching stop layer to form a fourth indentation located under the third indentation;
    Etching the tunneling layer to form a fifth indentation located under the fourth indentation;
    The said first and second indentations form a first gate groove;
    The said third, fourth, and fifth indentations form a second gate groove;
    The said first and second gate grooves forms a dual-gate-groove structure, in which the gate electrode can form a Schottky contact with the higher energy gap Schottky capping layer.

For further understanding the characteristics and effects of the present invention, some preferred embodiments referred to drawings are in detail described as follows.

DETAILED DESCRIPTIONS OF PREFERRED EMBODIMENTS

FIG. 3A is a structure cross section view for a HFET device according to the present invention, which comprises a substrate 301, a channel layer 302, a spacing layer 303, a carrier supply layer 304, a Schottky layer 305, a Schottky capping layer 311, a tunneling layer 312, a first etching stop layer 306, a first n type doped layer 307, a gate electrode 308, a source electrode 309, and a drain electrode 310.

In the present structure, the substrate 301 is a GaAs substrate, preferably a semi-insulating GaAs grown by liquid encapsulated Czochralski (LEC) technique. The channel layer 302 is formed on the semi-insulating GaAs substrate 301. The material for the channel layer 302 is GaAs, or preferably a strained $In_xGa_{1-x}As$ layer, which is usually called as a pseudomorphic high electron mobility transistor (pHEMT). On the channel layer 302 is a modulation doped layer, which is made of a medium energy gap material. In the structure of the present invention, the modulation doped layer contains the said spacing layer 303, the said carrier supply layer 304, and the said Schottky layer 305. The said medium energy gap material is preferably $Al_xGa_{1-x}As$ with an Al content, x, between 0.15 and 0.3. On the Schottky layer 305 is the Schottky capping layer 311 formed by a higher energy gap material. The said higher energy gap material is preferably $Al_xGa_{1-x}As$ with an Al content, x, between 0.3 and 1.0. On the Schottky capping layer 311 is the tunneling layer 312 formed by a lower energy gap material, and the said lower energy gap material is preferably a GaAs or an InGaAs layer. On the tunneling layer 312 is the first etching stop layer 306. Finally, the first etching stop layer 306 is covered with the first n type doped layer 307. The material used for the first n type doped layer is GaAs, which is usually heavily doped with a preferable doping concentration at least up to $1 \times 10^{18}$ cm$^{-3}$, so that metal layers can be deposited directly on this layer to form ohmic contacts for the source electrode 309 and the drain electrode 310. By using a multiple selective etching process, the first n type doped layer 307, the first etching stop layer 306, and the tunneling layer 312 can be removed to form a single gate-groove structure, where the gate electrode 308 can form a Schottky contact directly with the Schottky capping layer 311. The suitable thickness of the Schottky capping layer 311 is between 1 and 15 nm. The electron concentration of the channel layer 302 can be modulated by a applying a gate voltage to the gate electrode 308 and the carrier supply layer 304, whereby the conductivity between source and drain can be changed. In the structure of the present invention, the tunneling layer 312 can be a GaAs layer or preferably an In$_x$Ga$_{1-x}$As layer, with a preferable thickness between 1 and 10 nm. This design is helpful for reducing the on-state resistance, $R_{on}$, of the device.

Because the tunneling layer 312 is made of a lower energy gap material, the device will show poor reliability if the Schottky gate electrode forms directly on the tunneling layer 312. Therefore, it is necessary to fabricate a gate groove being etched down to the Schottky capping layer 311 via a multiple selective etching process. Since the Schottky capping layer 311 is made of a higher energy gap material, a higher breakdown voltage can be achieved when the Schottky gate electrode is formed on the Schottky capping layer, hence improving the device reliability.

FIG. 3B is the cross-sectional view of a HFET structure with a dual gate groove structure according to the present invention. The structure of FIG. 3B is similar to FIG. 3A. The main difference is that a second etching stop layer 301$a$ has been inserted between the first etching stop layer 306 and the Schottky layer 305, and a second n type doped layer 307$a$ has been inserted on the second etching stop layer 306$a$, as shown in FIG. 3B.

The multiple selective etching process provided by the present invention can form a gate groove located above the higher energy gap Schottky capping layer 311, whereby the gate electrode 308 can contact directly with the higher energy gap Schottky capping layer 311. The multiple selective etching process for the HFET structure is described as follows. First, the location and size of the first gate groove are defined on the first n type doped layer 307 by using the conventional photolithography. Then, the first n type doped layer 307 is etched by using a first etching process to form a first indentation. The first etching process can either be a wet etching or a dry etching, as long as the etchant can have a good etching selectivity between the first n type doped layer 307 and the first etching stop layer 306. If the first n type doped layer 307 is GaAs, while the first etching stop layer 306 is AlAs or InGaP, succinic acid, citric acid, or acetic acid are suitable etchants for etching the GaAs layer. The etching process will be terminated at the etching stop layer 306, since the succinic acid, citric acid, or acetic acid cannot etch AlAs and InGaP. The second etching process is then performed to remove the etching stop layer 306, forming a second indentation located under the first indentation. The second etching process can be either a dry etching or a wet etching, as long as the etchant has a good etching selectivity between the AlAs and the tunneling layer 312 that is made of a lower energy gap material, such as GaAs or InGaAs. For a wet etching, a solution of hydrochloric acid (HCl), ammonia (NH$_4$OH), or hydrogen peroxide (H$_2$O$_2$) are suitable etchants for AlAs in the second etching process. The solution of hydrochloric acid (HCl) is also a good etchant for InGaP. The tunneling layer 312 made of GaAs or InGaAs is therefore acting as an etching stop layer for the second etching process. Finally, a third etching process is performed to remove the tunneling layer 312, in which a suitable etchant is so selected that the etching process can be terminated at the Schottky capping layer 311, which is made of a higher energy gap material, such as AlGaAs. After the third etching process, a third indentation can be formed just under the second indentation. For a wet etching, a solution of succinic acid, citric acid, or acetic acid can be used as the etchant for GaAs or InGaAs in the third etching process. The third etching process will finally terminate at the higher energy gap Schottky capping layer 311. After performing the three selective etching processes, a single gate groove structure will form down to the higher energy gap Schottky capping layer 311. The device fabrication is finally completed by depositing a metal layer on the Schottky capping layer as the Schottky gate electrode located in the single gate groove structure of the device.

The multiple selective etching process provided by the present invention can also be used for the fabrication of a dual gate groove structure, where the gate electrode 308 can form Schottky contact directly on the higher energy gap Schottky capping layer 311. The process for fabricating the dual gate groove structure is similar to that for the single gate groove structure. The location and size of the first gate groove on the first n type doped GaAs capping layer 307 is first defined by photolithography. The GaAs capping layer 307 is then etched by using a first etching process to form a first indentation. If the first etching stop layer 306 is made of AlAs or InGaP, a solution of succinic acid, or acetic acid can be used as the etchant for GaAs. The etching process will be terminated by the first etching stop layer 306. Then, the first etching stop layer 306 can be removed by a second etching process, forming a second indentation located under the first indentation. The first indentation and the second indentation together form a first gate groove. In the second etching process, a solution of hydrochloric acid (HCl), ammonia (NH$_4$OH), or hydrogen peroxide (H$_2$O$_2$) can be used to etch the AlAs. A solution of hydrochloric acid (HCl) can be used to etch the InGaP. The steps described above can be repeatedly used to form a second gate groove. The second n type doped GaAs layer 307$a$ is first etched by a third etching process to form a third indentation, and the second etching stop layer 306$a$ is then etched by a fourth etching process to form a fourth indentation. Finally, the tunneling layer 312 is etched by a fifth etching process to form a fifth indentation. The fifth etching process will be terminated by the higher energy gap Schottky capping layer 311. The third, fourth, and fifth indentations together form a second gate groove located under the first gate groove. The first and the second gate grooves thus form a dual gate groove structure. The device fabrication is finally completed by depositing a metal layer on the Schottky capping layer 311 as the Schottky gate electrode located in the dual gate groove structure of the device.

The device performances of the HFET with the structure according to the present invention have been examined experimentally. It has been confirmed that the on-state resistance of the device can be effectively decreased, while the breakdown voltage of the Schottky gate can be increased, and thereby the device reliability can be improved. The characteristics of the drain current, $I_d$, as a function of the gate voltage, $V_g$, of the devices with the HFET structure of the present invention and the conventional HFET structure are shown in FIGS. 4A and 4B, respectively, where $V_g=-3$ V, $V_d=14.5$ V, and the test time is 20 hrs. It can be seen from FIG. 4A that the drain current $I_d$ of the conventional device decreases after a long time biasing. For the device of the present invention shown in FIG. 4B, both the drain current $I_d$ and the gate pinch off voltage are not affected by the stress testing even after 20 hrs. Therefore, it is obvious that the structure and fabrication method according to the present invention can improve the reliability of the device. FIG. 5 shows the result of HTOL analysis for the reliability of on-state resistance, $R_{on}$, of the device according to the present invention. It can be seen that the on-state resistance $R_{on}$ of the device remains constant under the test condition of 8 V, 17 mA, 165° C. It is therefore obvious that the present invention can provide a device with high reliability.

To sum up, the present invention indeed can get its anticipatory object that is to provide a HFET structure in which a Schottky capping layer formed by a higher energy gap material is covered on a Schottky layer, and a tunneling layer formed by a lower energy gap material is covered on the Schottky capping layer, and a multiple selective etching process is used to fabricate this structure so that the device on-state resistance can be decreased while breakdown voltage of the Schottky gate can be increased, hence improving the device reliability.

The description referred to the drawings stated above is only for the preferred embodiments of the present invention. Many equivalent local variations and modifications can still be made by those skilled at the field related with the present invention and do not depart from the spirits of the present invention, so they should be regarded to fall into the scope defined by the appended claims.

Figure 1A:
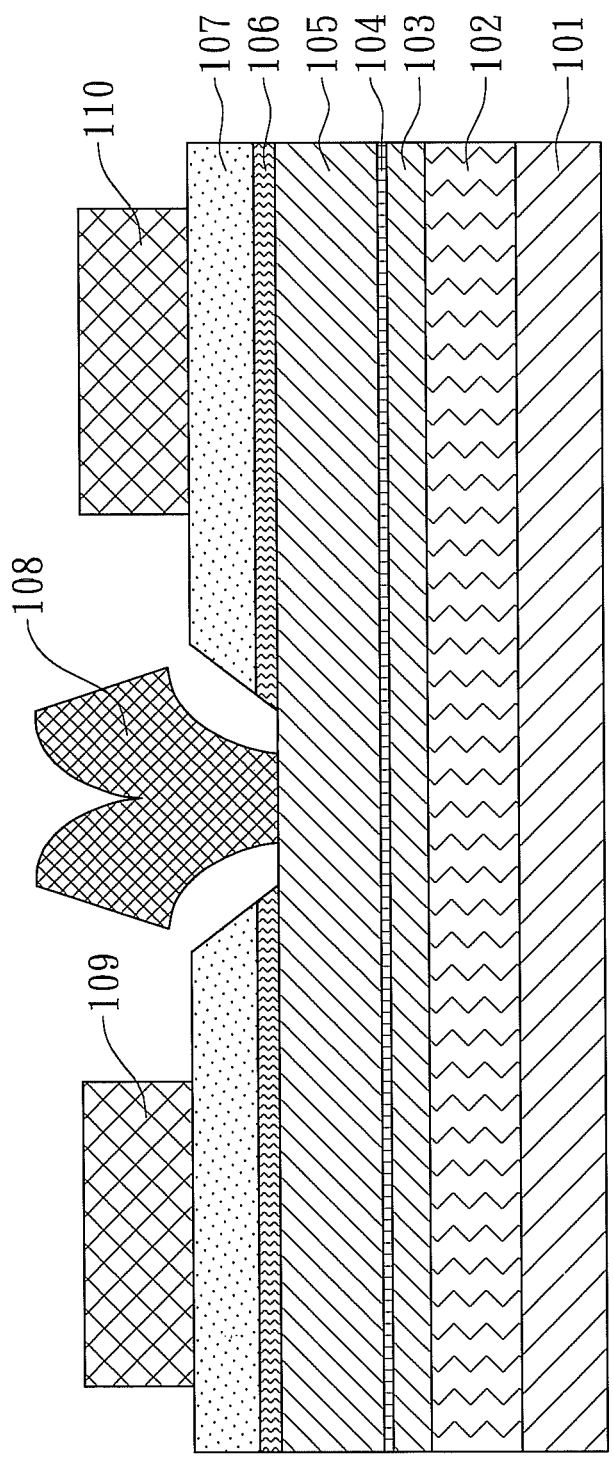
FIGS. 1A and 1B are schematics showing the cross-sectional views of the structure for a conventional HFET device.
Figure 1B:
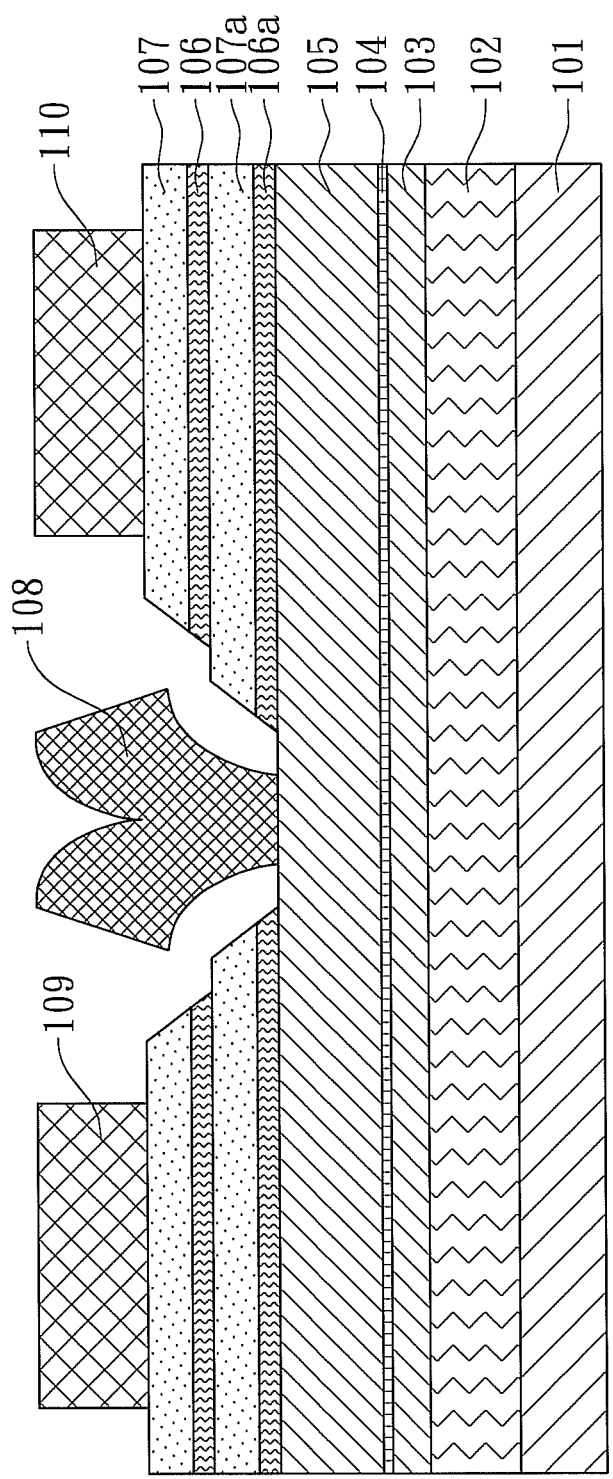
Figure 2A:
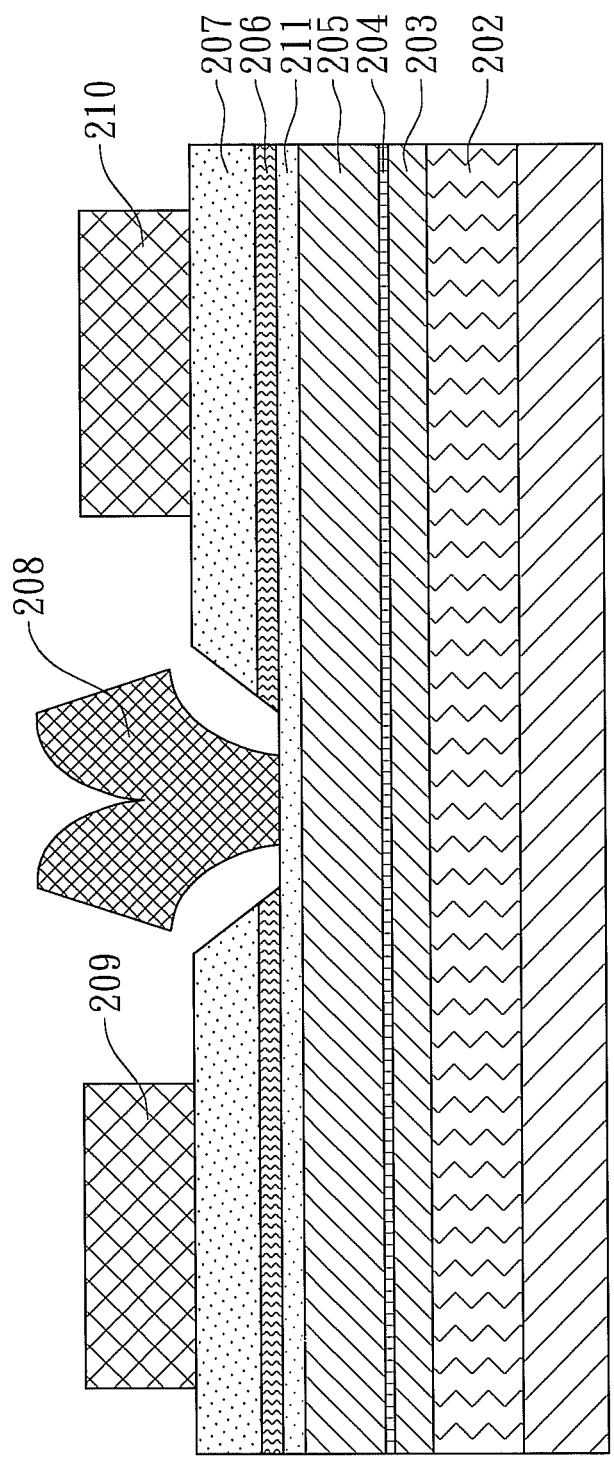
FIGS. 2A and 2B are schematics showing the cross-sectional views of the structure for another conventional HFET device.
Figure 2B:
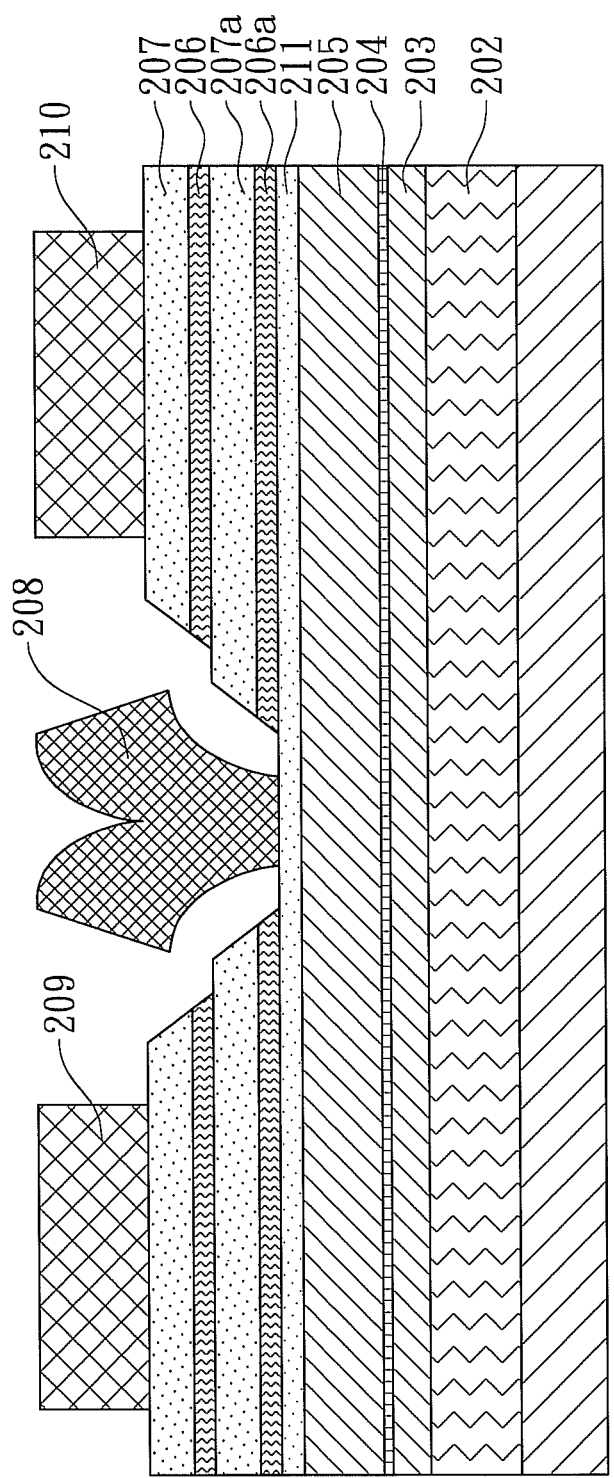
Figure 3A:
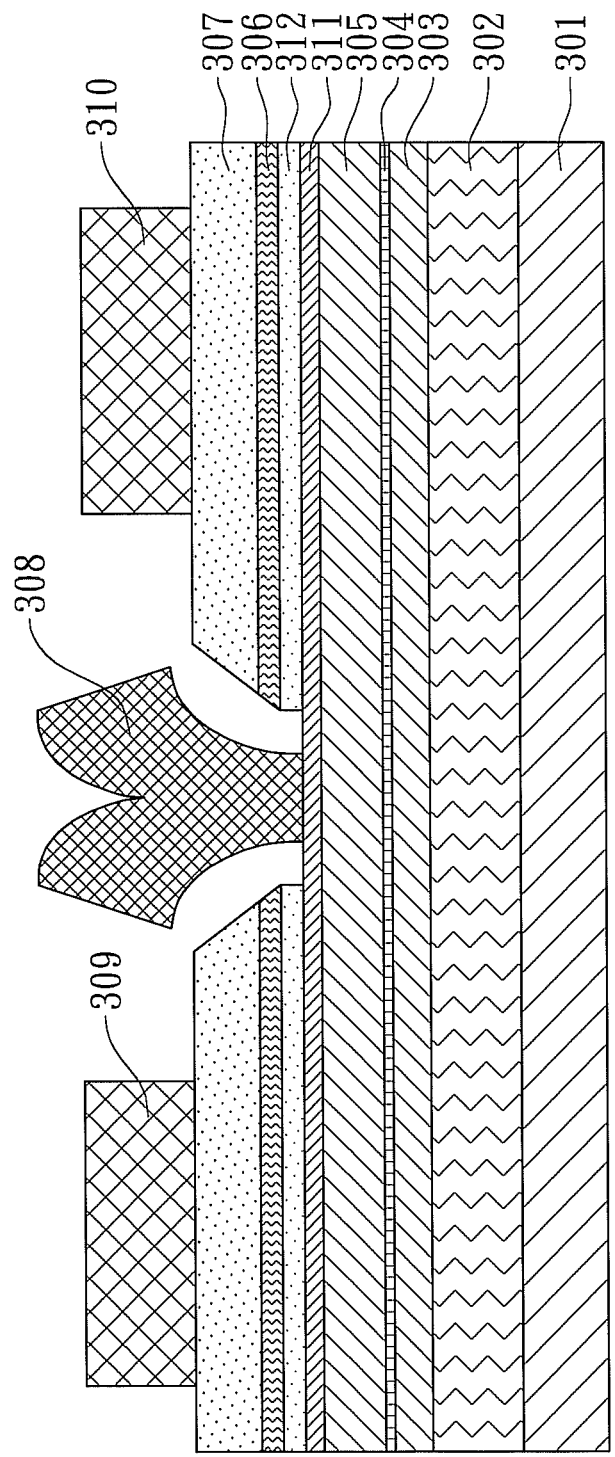
FIGS. 3A and 3B are schematics showing the cross-sectional views of the structure for a HFET device according to the present invention.
Figure 3B:
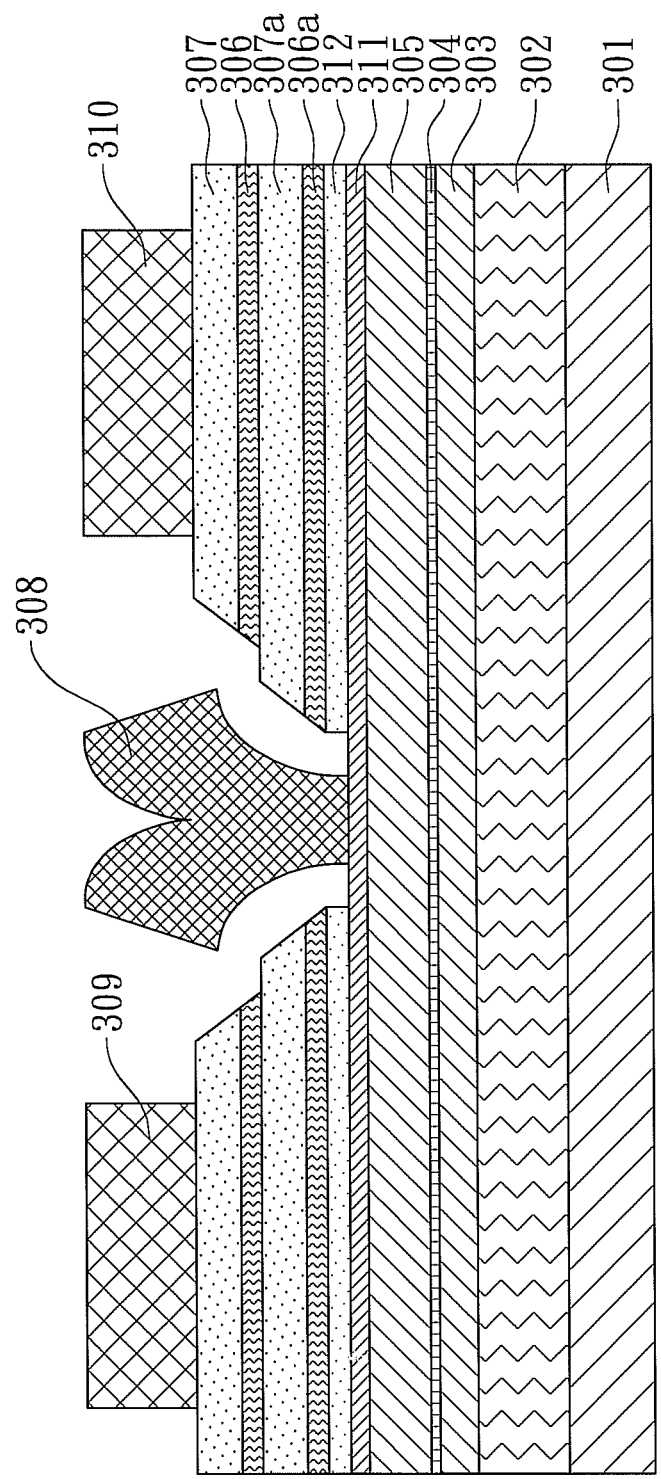
Figure 4A:
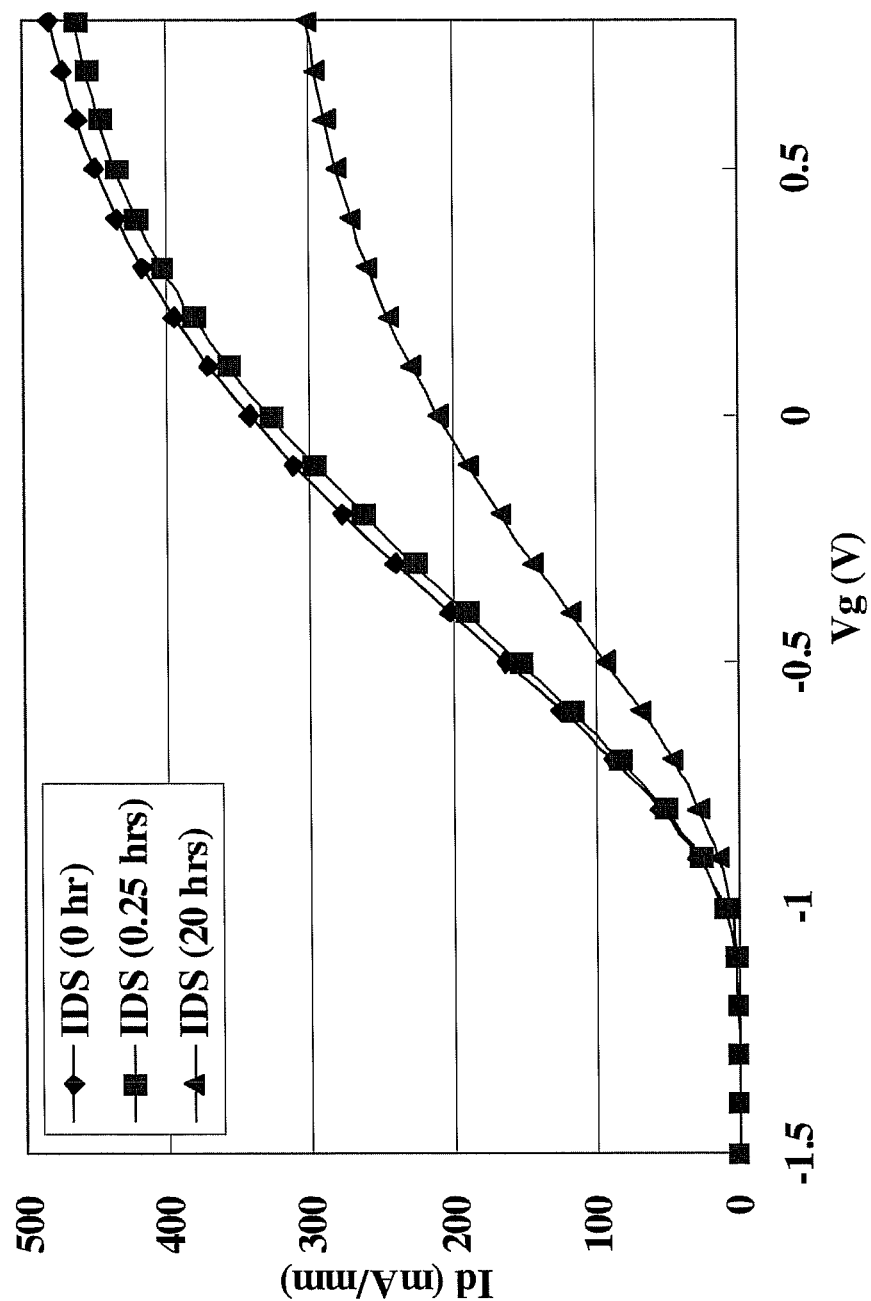
FIG. 4A is the drain current, $I_d$, as a function of the gate voltage, $V_g$, of a conventional HFET device under an applied bias voltage $V_d$=14.5 V.
Figure 4B:
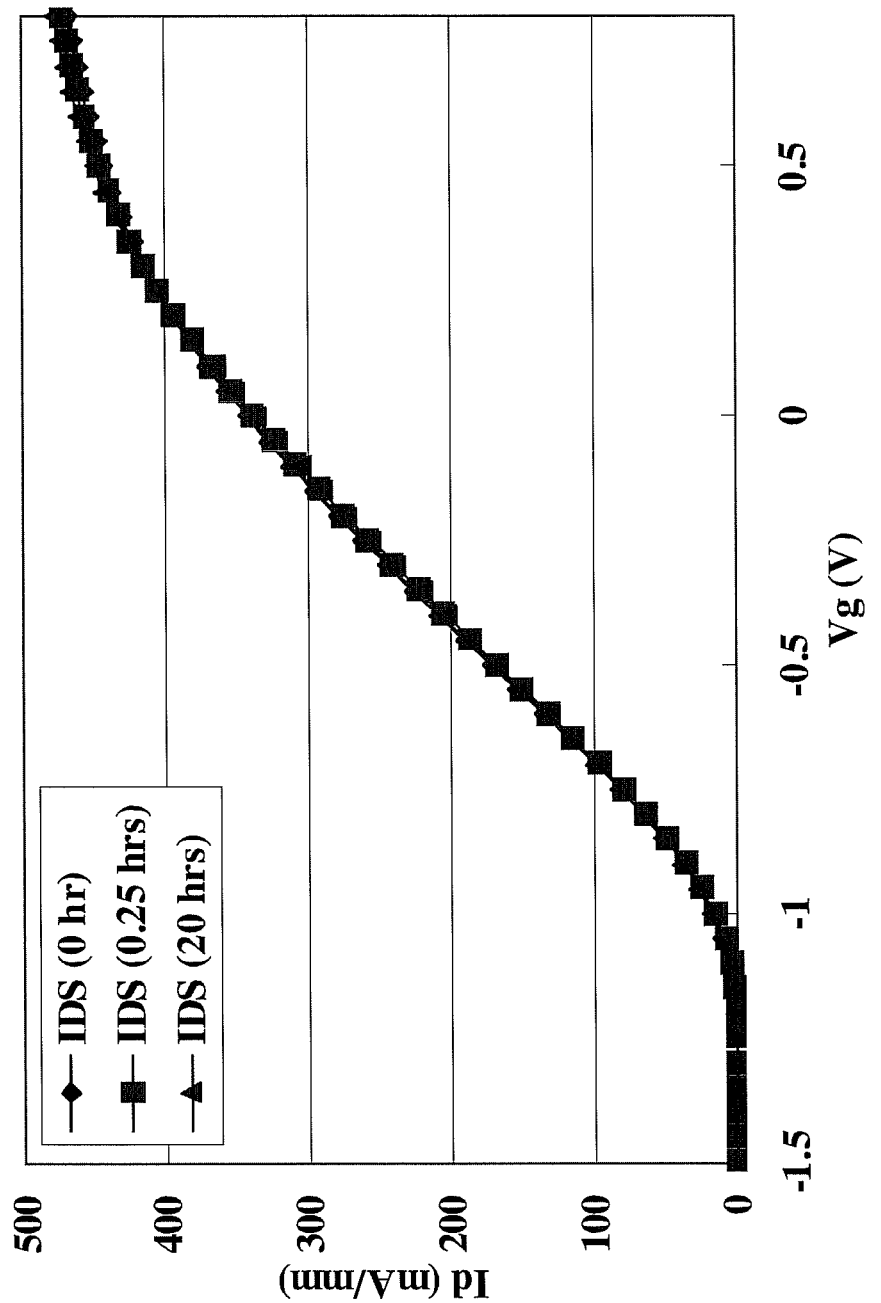
FIG. 4B is the drain current, $I_d$, as a function of the gate voltage, $V_g$, of an improved HFET device according to the present invention under an applied bias voltage $V_d$=14.5 V.
Figure 5:
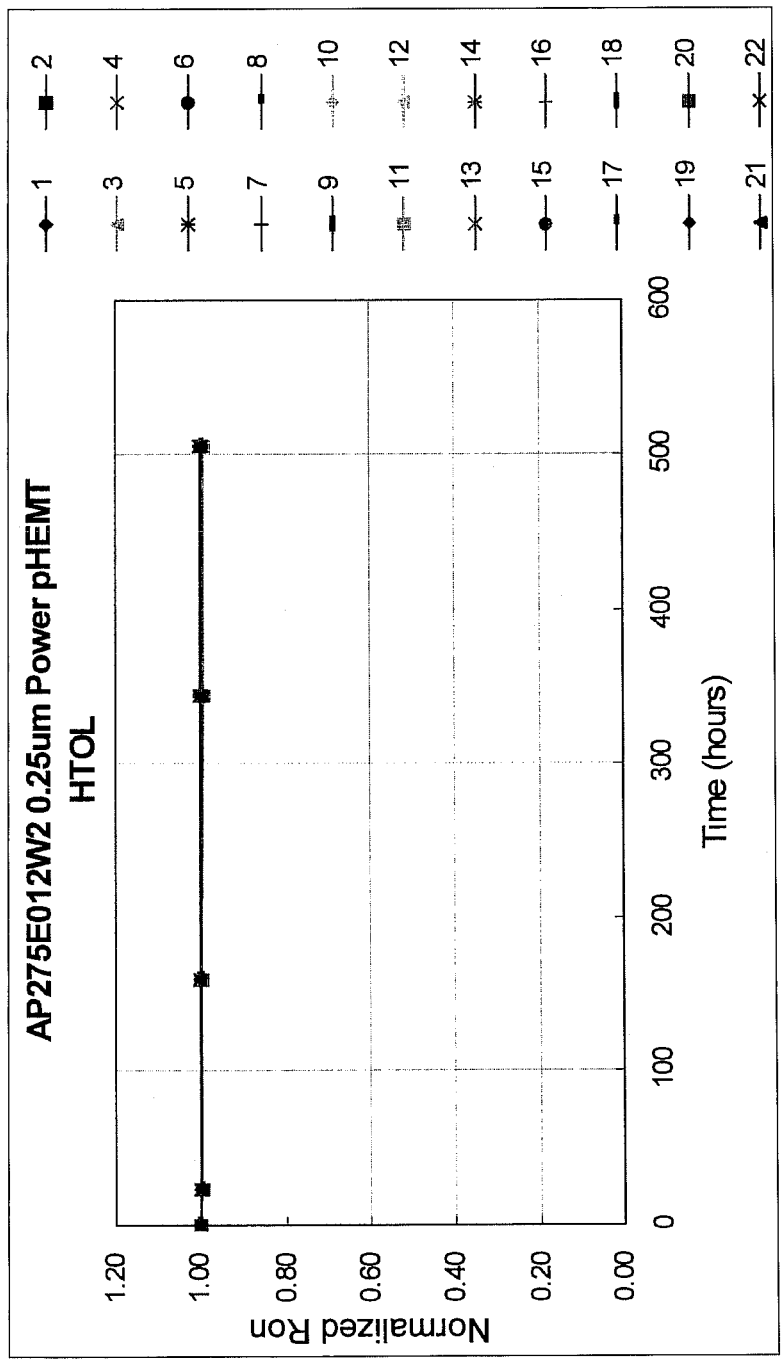
FIG. 5 the result of HTOL analysis for the reliability of on-state resistance, $R_{on}$, of an improved HFET device according to the present invention.

The invention claimed is:

1. A structure of heterojunction field effect transistor (HFET) comprises sequentially:
   a substrate;
   a channel layer;
   a spacing layer;
   a carrier supply layer;
   a Schottky layer;
   a Schottky capping layer;
   a tunneling layer;
   a first etching stop layer;
   a first n type doped layer;
   a source electrode;
   a drain electrode; and
   a gate electrode,
   wherein the Schottky capping layer is formed by a higher energy gap material, and the higher energy gap material used for the ca in layer is $Al_xGa_{1-x}As$ with an Al content, x, between 0.3 and 1.0,
   wherein the tunneling layer is formed by a lower energy gap material, and the lower energy gap a material used for the tunneling is GaAs or $In_xGa_{1-x}As$,
   wherein the Schottky layer is formed by a medium band gap material,
   wherein a single gate groove is formed between the source electrode and the drain electrode, the bottom of the single gate groove is the Schottky capping layer such that the gate electrode does not contact directly with the tunneling layer and the gate electrode forms a Schottky contact directly with the Schottky capping layer in the single gate groove,
   wherein the source and drain electrodes each forms a contact with the first n type doped layer respectively.

2. A structure of HFET according to claim 1, wherein the thickness of the higher energy gap Schottky capping layer is between 3.5 and 15 nm.

3. A structure of HFET according to claim 1, wherein the thickness of the lower energy gap tunneling layer is between 1 and 6 nm.

4. A structure of HFET according to claim 1, wherein the material used for the first n type doped layer is GaAs.

5. A structure of HFET according to claim 1, wherein the material used for the first etching stop layer is AlAs.

6. A structure of HFET according to claim 1, wherein the material used for the first etching stop layer is InGaP.

7. A structure of HFET according to claim 1 further contains:
   a second etching stop layer, and
   a second n type doped capping layer;
   between the tunneling layer and the first etching stop layer,
   wherein the second etching stop layer is located above the tunneling layer, and
   wherein the second n type doped layer is located above the second etching stop layer and below the first etching stop layer.

8. A structure of HFET according to claim 1, wherein the said medium band gap material used for the Schottky layer is $Al_xGa_{1-x}As$ with an Al content, x, between 0.15 and 0.3.

9. A structure of HFET according to claim 2, wherein the thickness of the lower energy gap tunneling layer is between 1 and 6 nm.

10. A structure of HFET according to claim 7, wherein the material used for the second n type doped layer is GaAs.

11. A structure of HFET according to claim 7, wherein the material used for the second etching stop layer is AlAs.

12. A structure of HFET according to claim 7, wherein the material used for the second etching stop layer is InGaP.

* * * * *